(12) United States Patent
Leobandung et al.

(10) Patent No.: US 9,673,056 B2
(45) Date of Patent: Jun. 6, 2017

(54) METHOD TO IMPROVE FINFET CUT OVERLAY

(71) Applicant: INTERNATIONAL BUSINESS MACHINES CORPORATION, Armonk, NY (US)

(72) Inventors: Effendi Leobandung, Stormville, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 14/658,678

(22) Filed: Mar. 16, 2015

(65) Prior Publication Data

US 2016/0276163 A1    Sep. 22, 2016

(51) Int. Cl.
| | | |
|---|---|---|
| H01L 21/00 | (2006.01) | |
| H01L 21/308 | (2006.01) | |
| H01L 21/8234 | (2006.01) | |
| H01L 29/66 | (2006.01) | |
| H01L 21/84 | (2006.01) | |

(52) U.S. Cl.
CPC .. *H01L 21/3086* (2013.01); *H01L 21/823431* (2013.01); *H01L 21/845* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 8,759,943 B2 | 6/2014 | Tseng et al. | |
| 8,791,028 B2 | 7/2014 | Okano | |
| 8,829,617 B2 | 9/2014 | Haran et al. | |
| 2004/0262688 A1* | 12/2004 | Nowak | H01L 27/1203 257/350 |
| 2005/0255643 A1 | 11/2005 | Ahn et al. | |
| 2012/0313170 A1* | 12/2012 | Chang | H01L 29/66545 257/347 |
| 2013/0140638 A1* | 6/2013 | Dixit | H01L 27/088 257/349 |
| 2013/0252349 A1* | 9/2013 | Pradhan | H01L 21/26513 438/4 |
| 2013/0330889 A1* | 12/2013 | Yin | H01L 21/823821 438/197 |
| 2013/0334614 A1 | 12/2013 | Liaw | |

(Continued)

FOREIGN PATENT DOCUMENTS

CN            103474397 A        12/2013

OTHER PUBLICATIONS

Wet Isotropic and Anisotropic Etching by Kim et al., 2007.*

*Primary Examiner* — Evren Seven
(74) *Attorney, Agent, or Firm* — Scully, Scott, Murphy & Presser, P.C.; Louis J. Percello, Esq.

(57) ABSTRACT

A patterned photoresist having an overlay tolerance of $(x+y)/2$ is formed over preselected hard mask portions or semiconductor fin portions, wherein x is a width of a semiconductor fin and y is a distance between a neighboring pair of semiconductor fins. Hard mask portions or semiconductor fin portions not protected by the patterned photoresist are then removed by an isotropic etching process. The patterned photoresist is removed. In some embodiments, the remaining hard mask portions are employed as fin forming etch masks.

16 Claims, 12 Drawing Sheets

(56) References Cited

U.S. PATENT DOCUMENTS

| | | |
|---|---|---|
| 2014/0131813 A1 | 5/2014 | Liaw |
| 2014/0264631 A1* | 9/2014 | Wei .................... H01L 21/76224 |
| | | 257/401 |
| 2015/0072527 A1* | 3/2015 | Ng ...................... H01L 21/3086 |
| | | 438/696 |
| 2015/0243667 A1* | 8/2015 | Liaw .................. H01L 27/1104 |
| | | 257/390 |
| 2015/0318215 A1* | 11/2015 | Taylor, Jr. ....... H01L 21/823481 |
| | | 257/506 |
| 2016/0133726 A1* | 5/2016 | Sung ................. H01L 29/66795 |
| | | 438/283 |
| 2016/0148935 A1* | 5/2016 | Chen .................. H01L 27/0924 |
| | | 257/369 |

\* cited by examiner

METHOD TO IMPROVE FINFET CUT OVERLAY

BACKGROUND

The present application relates to semiconductor device manufacturing, and more particularly to a method of reducing the overlay tolerance requirement for removing, i.e., cutting, unwanted semiconductor fins.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (finFETs) is the next step in the evolution of complementary metal oxide semiconductor (CMOS) devices. Semiconductor fin field effect transistors (FETs) can achieve higher drive currents with increasingly smaller dimensions as compared to conventional planar FETs. In finFET devices, a functional gate structure straddles a semiconductor fin.

Semiconductor fins are formed by patterning a semiconductor substrate utilizing fin forming etch masks. Unwanted semiconductor fins can be removed by cutting some of the semiconductor fins after fin formation. As the semiconductor fin pitch shrinks, the requirement to cut the unwanted semiconductor fins becomes more problematic oftentimes leaving unwanted semiconductor fin residue or excessive semiconductor fin removal.

In view of the above, there is a continued need to provide a method for fabricating semiconductor fins in which unwanted semiconductor fins can be removed while avoiding the problems associated in the prior art.

SUMMARY

A patterned photoresist having an overlay tolerance of $(x+y)/2$ is formed over preselected hard mask portions or semiconductor fin portions, wherein x is a width of a semiconductor fin or fin portion and y is a distance between a neighboring pair of semiconductor fins or fin portions. Hard mask portions or semiconductor fin portions not protected by the patterned photoresist are then removed by an isotropic etching process. Thereafter, the patterned photoresist is removed. In some embodiments and when semiconductor fins have not yet be formed, the remaining hard mask portions are employed as fin forming etch masks.

In one aspect of the present application, a method of forming semiconductor fins is provided. In one embodiment of the present application, the method includes providing a plurality of hard mask portions on a semiconductor substrate. Next, a patterned photoresist having an overlay tolerance of $(x+y)/2$ is formed over preselected hard mask portions, wherein x is a width of a semiconductor fin and y is a distance between a neighboring pair of semiconductor fins. Hard mask portions that are not protected by the patterned photoresist are then removed by an isotropic etching process and thereafter the patterned photoresist is removed. Semiconductor fins are then formed in an upper semiconductor material portion of the semiconductor substrate, wherein the remaining hard mask portions are employed as fin forming etch masks.

In another embodiment of the present application, a method is provided that includes providing a plurality of semiconductor fin portions on substrate. Next a patterned photoresist having an overlay tolerance of $(x+y)/2$ is formed over preselected semiconductor fin portions, wherein x is a width of a semiconductor fin portion and y is a distance between a neighboring pair of semiconductor fin portions. Semiconductor fin portions that are not protected by the patterned photoresist are removed by an isotropic etching process. Next, the patterned photoresist is removed.

DETAILED DESCRIPTION

Figure 1A:
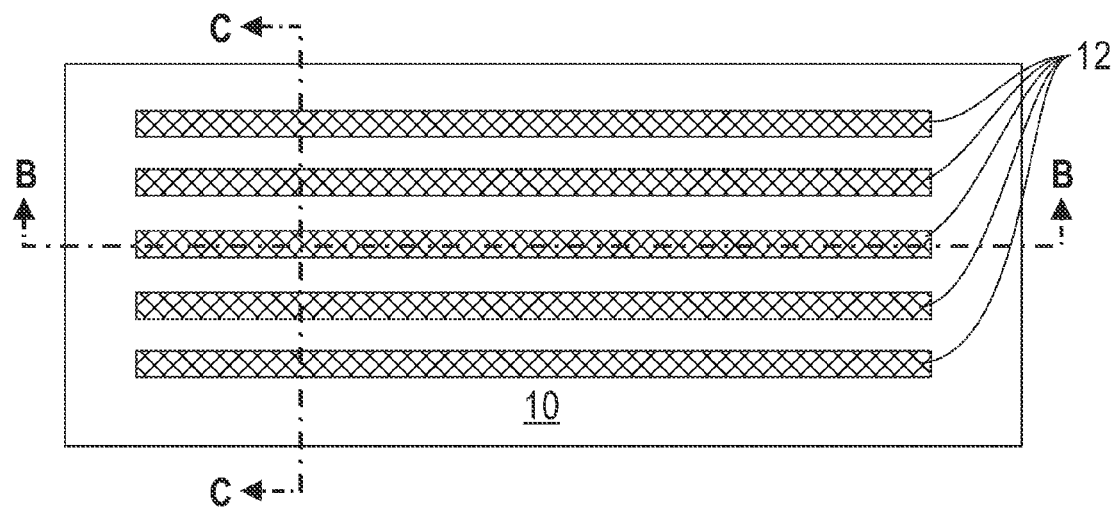
FIG. 1A to a top down view of an exemplary semiconductor structure including a plurality of hard mask lines located on a surface of a semiconductor substrate that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1B:
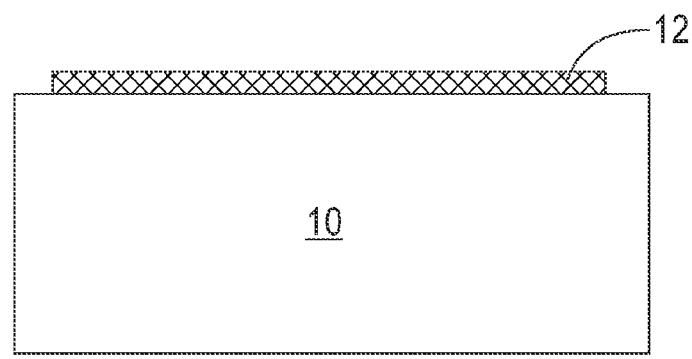
FIG. 1B is a vertical cross sectional view of the exemplary semiconductor structure along vertical plane B-B of FIG. 1A.
Figure 1C:
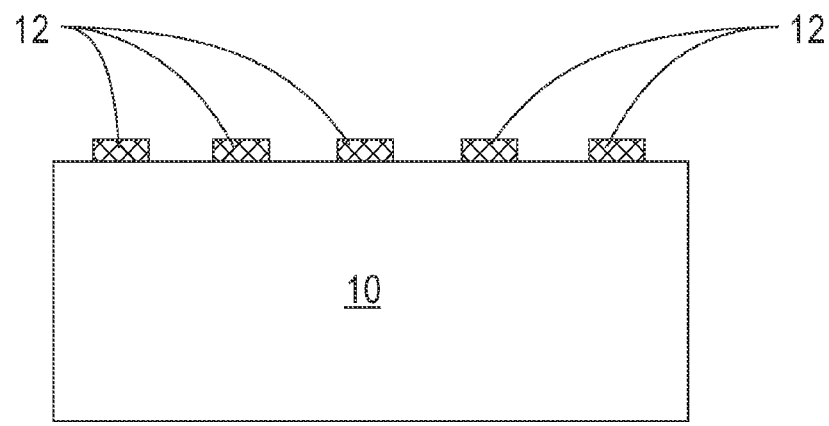
FIG. 1C is a vertical cross sectional view of the exemplary semiconductor structure along vertical plane C-C of FIG. 1A.
Figure 2A:
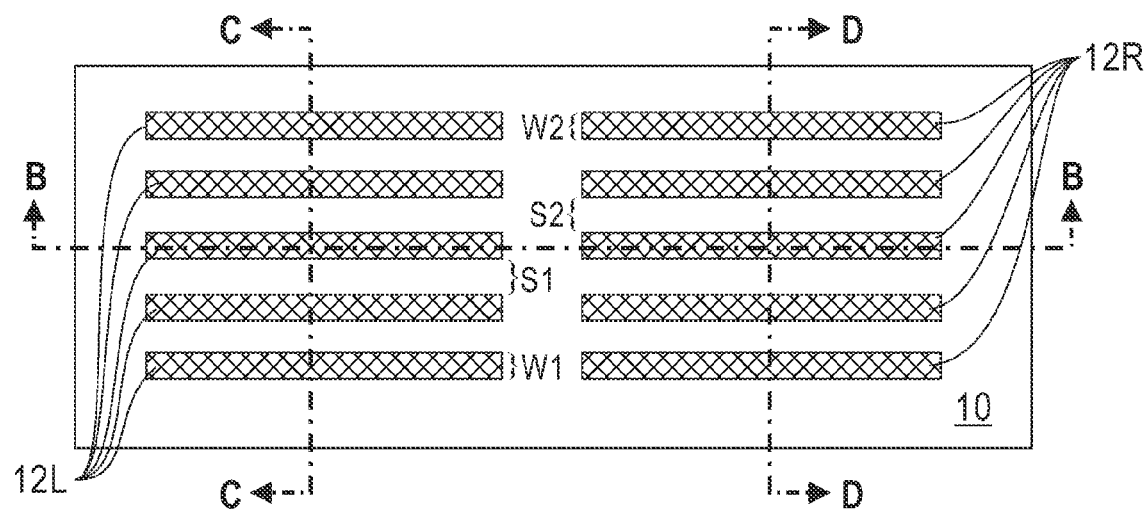
FIG. 2A is top down view of the exemplary semiconductor structure of FIG. 1A after cutting each hard mask line of the plurality of hard mask lines to provide a plurality of first hard mask portions located over one region of the semiconductor substrate, and a plurality of second hard mask portions located over another region of the semiconductor substrate.
Figure 2B:
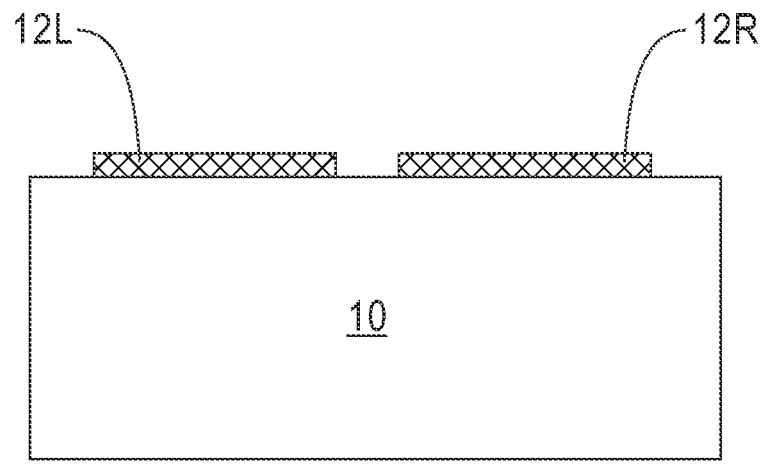
FIG. 2B is a vertical cross sectional view of the exemplary semiconductor structure along vertical plane B-B of FIG. 2A.
Figure 2C:
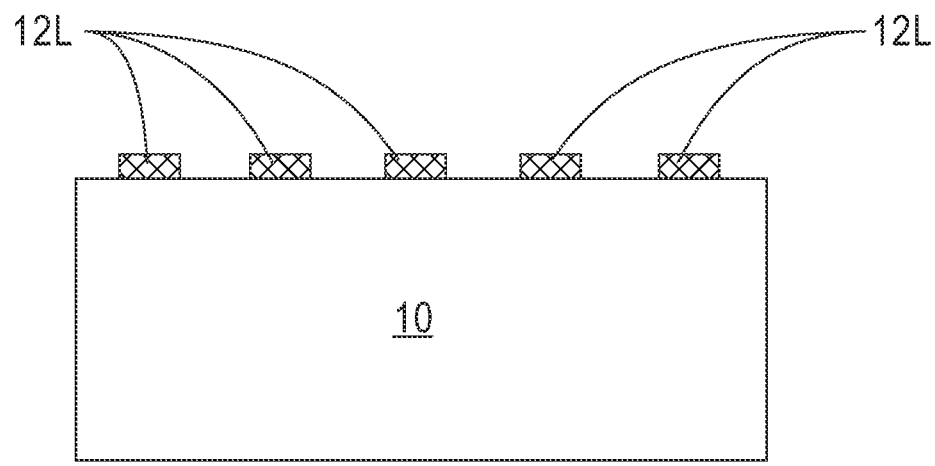
FIG. 2C is a vertical cross sectional view of the exemplary semiconductor structure along vertical plane C-C of FIG. 2A.
Figure 2D:
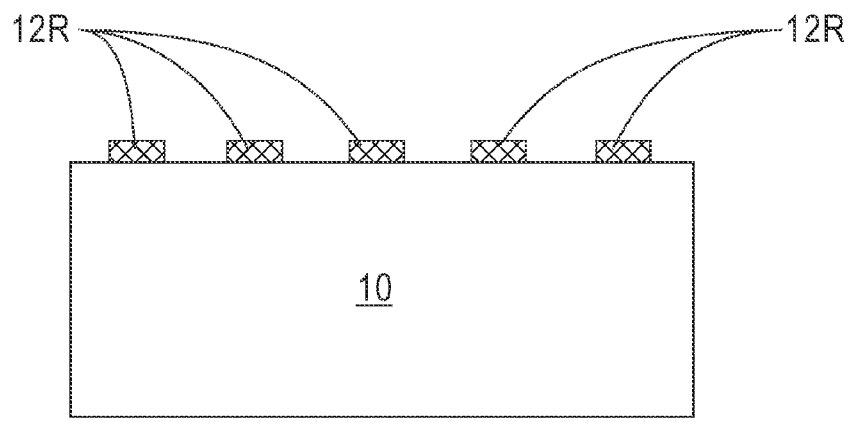
FIG. 2D is a vertical cross sectional view of the exemplary semiconductor structure along vertical plane D-D of FIG. 2A.
Figure 3A:
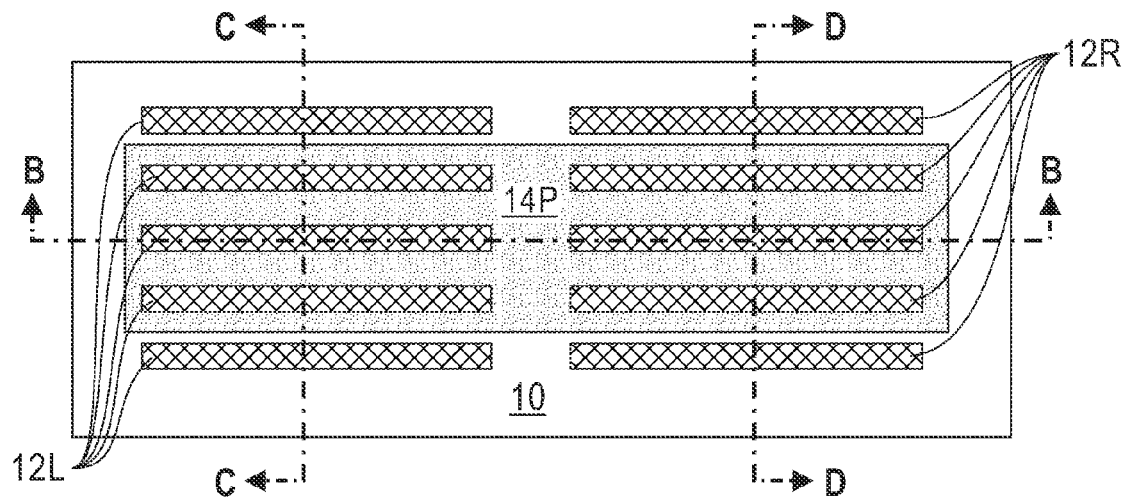
FIG. 3A is top down view of the exemplary semiconductor structure of FIG. 2A after forming a patterned photoresist having an overlay tolerance of $(x+y)/2$ over preselected first and second hard mask portions, wherein x is a width of a semiconductor fin and y is a distance between a neighboring pair of semiconductor fins.
Figure 3B:
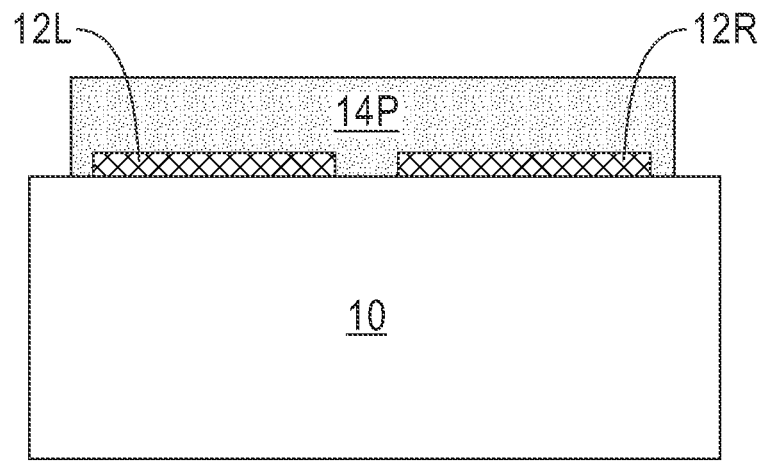
FIG. 3B is a vertical cross sectional view of the exemplary semiconductor structure along vertical plane B-B of FIG. 3A.
Figure 3C:
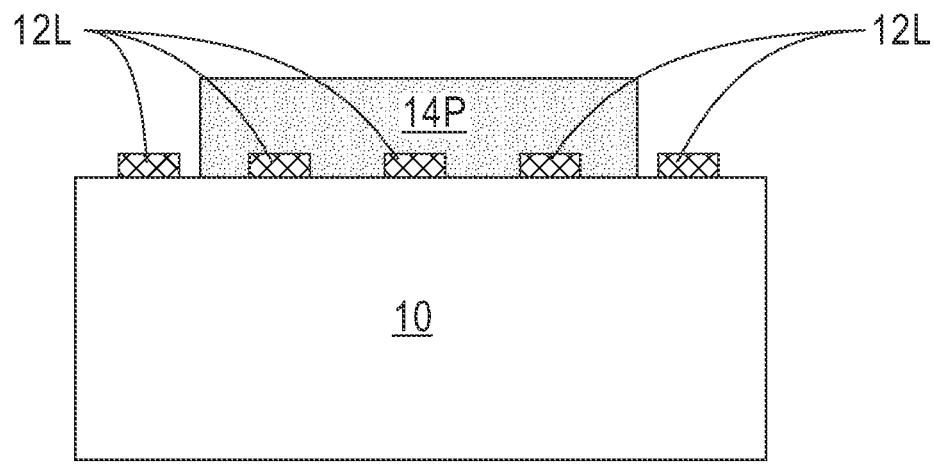
FIG. 3C is a vertical cross sectional view of the exemplary semiconductor structure along vertical plane C-C of FIG. 3A.
Figure 3D:
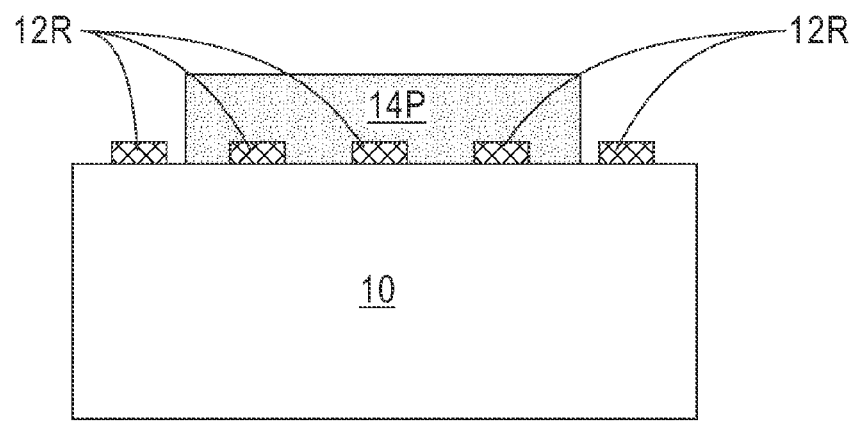
FIG. 3D is a vertical cross sectional view of the exemplary semiconductor structure along vertical plane D-D of FIG. 3A.
Figure 4A:
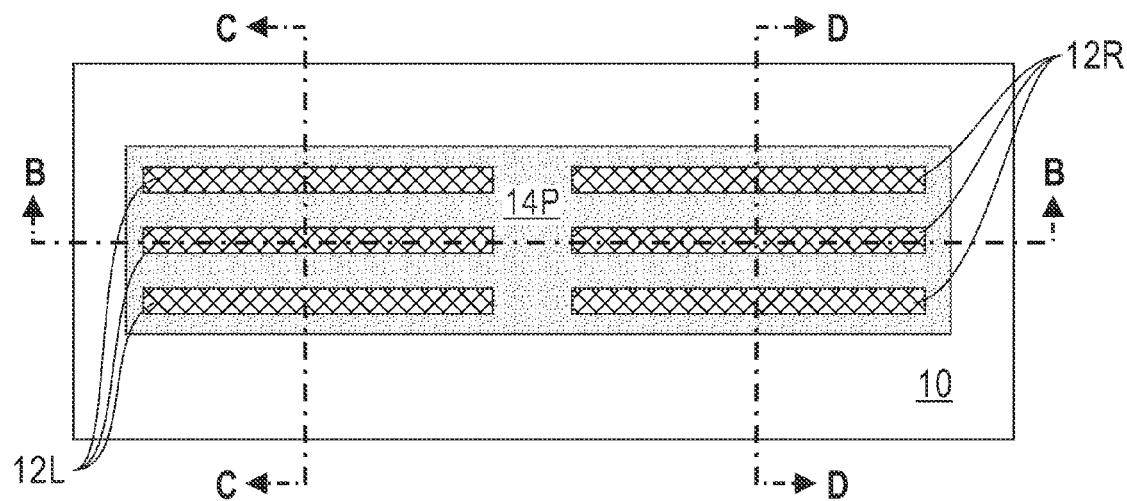
FIG. 4A is top down view of the exemplary semiconductor structure of FIG. 3A after performing an isotropic etch to remove first and second hard mask portions not protected by the patterned photoresist.
Figure 4B:
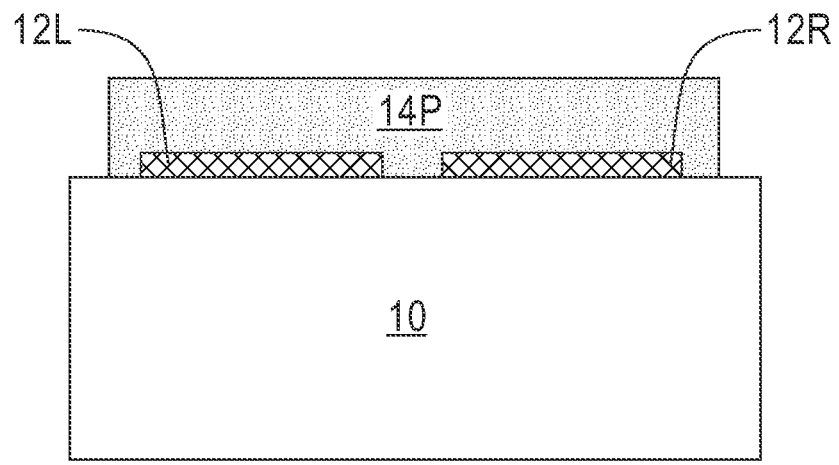
FIG. 4B is a vertical cross sectional view of the exemplary semiconductor structure along vertical plane B-B of FIG. 4A.
Figure 4C:
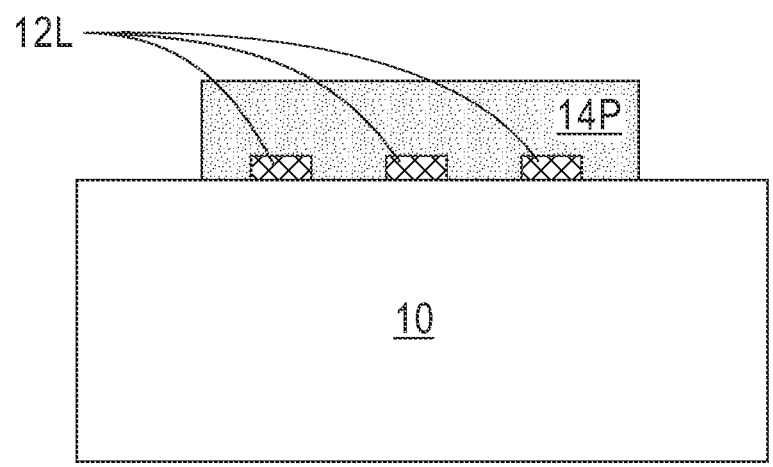
FIG. 4C is a vertical cross sectional view of the exemplary semiconductor structure along vertical plane C-C of FIG. 4A.
Figure 4D:
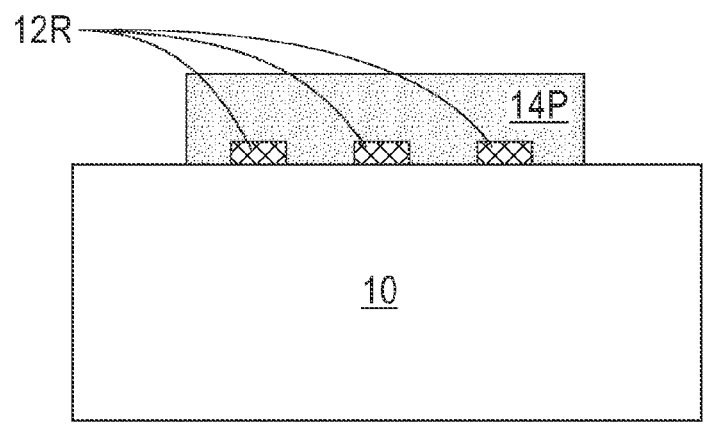
FIG. 4D is a vertical cross sectional view of the exemplary semiconductor structure along vertical plane D-D of FIG. 4A.
Figure 5A:
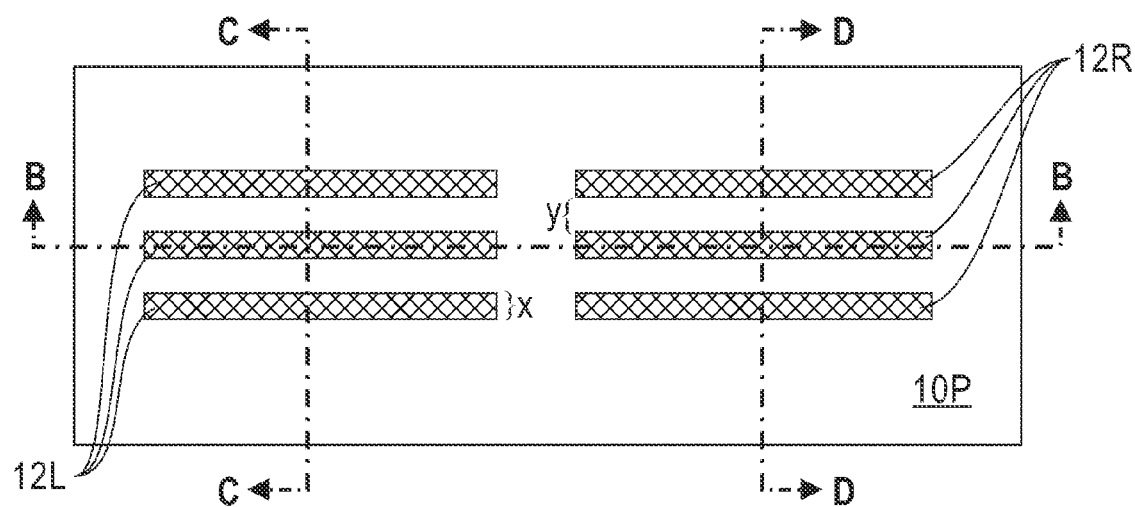
FIG. 5A is top down view of the exemplary semiconductor structure of FIG. 4A after removing the patterned photoresist and defining first semiconductor fins within an upper semiconductor material portion of a first region of the semiconductor substrate utilizing each remaining first hard mask portion as a first fin forming etch mask, and defining second semiconductor fins within the upper semiconductor portion of a second region of the semiconductor substrate utilizing each remaining second hard mask portion as a second fin forming etch mask.
Figure 5B:
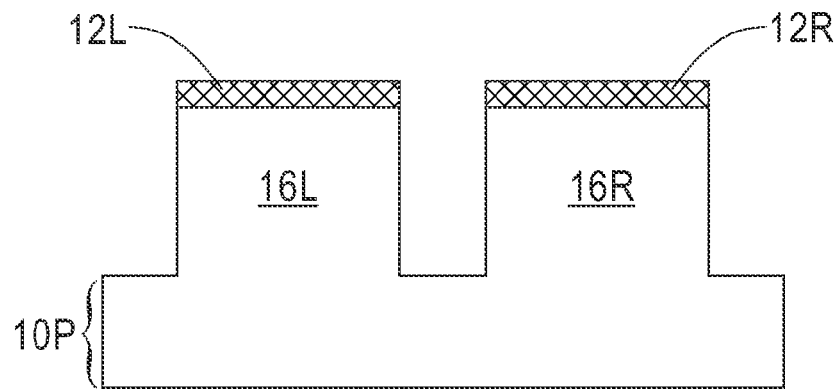
FIG. 5B is a vertical cross sectional view of the exemplary semiconductor structure along vertical plane B-B of FIG. 5A.
Figure 5C:
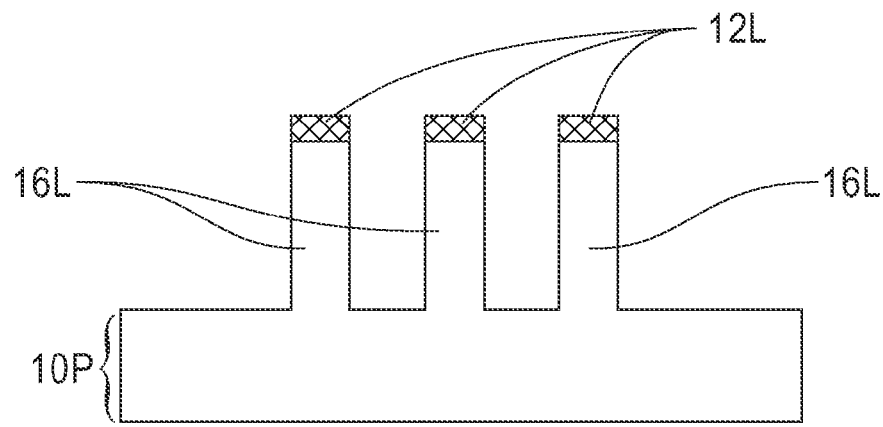
FIG. 5C is a vertical cross sectional view of the exemplary semiconductor structure along vertical plane C-C of FIG. 5A.
Figure 5D:
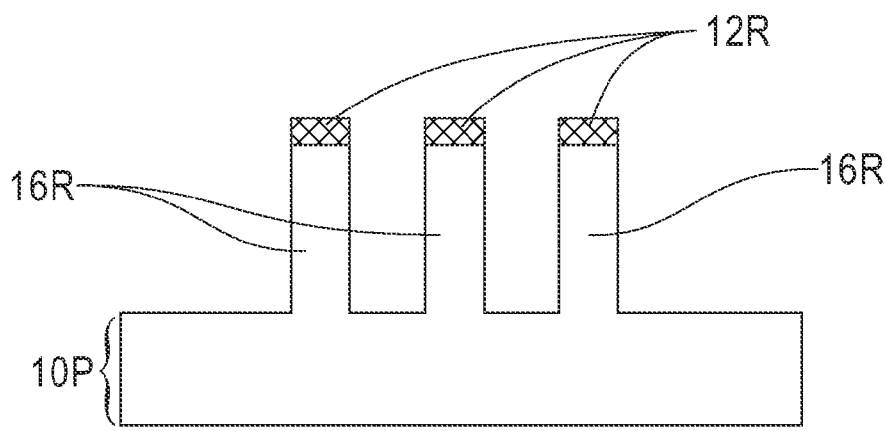
FIG. 5D is a vertical cross sectional view of the exemplary semiconductor structure along vertical plane D-D of FIG. 5A.
Figure 6A:
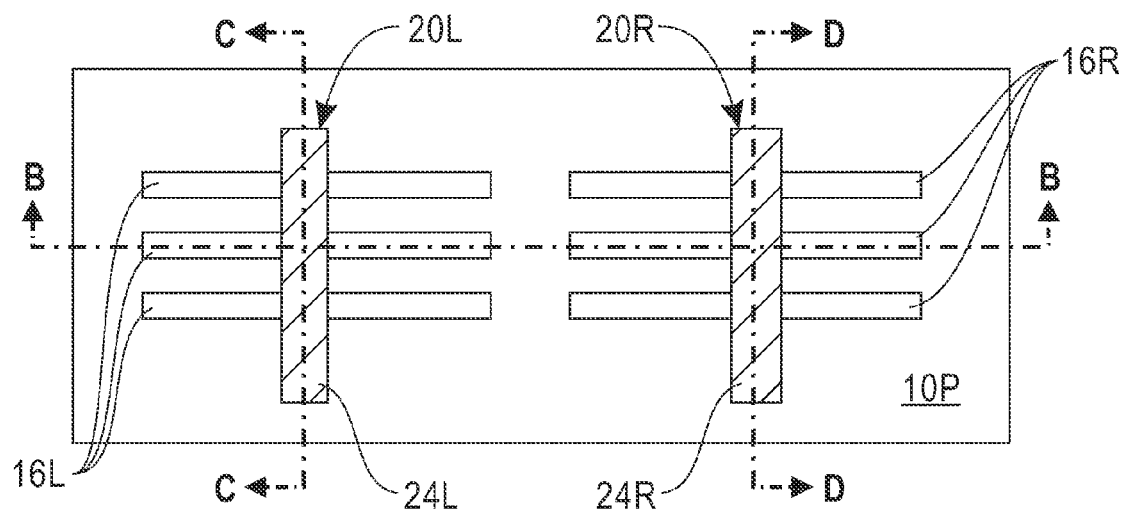
FIG. 6A is top down view of the exemplary semiconductor structure of FIG. 5 after removing the remaining first and second hard mask portions from atop each first and second semiconductor fin and forming a first functional gate structure straddling each first semiconductor fin, and a second functional gate structure straddling each second semiconductor fin.
Figure 6B:
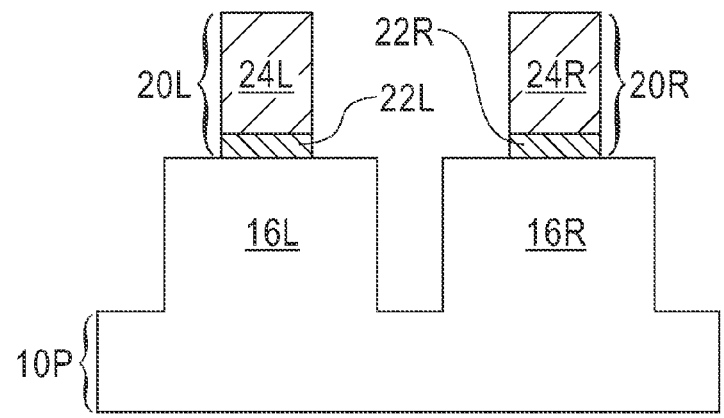
FIG. 6B is a vertical cross sectional view of the exemplary semiconductor structure along vertical plane B-B of FIG. 6A.
Figure 6C:
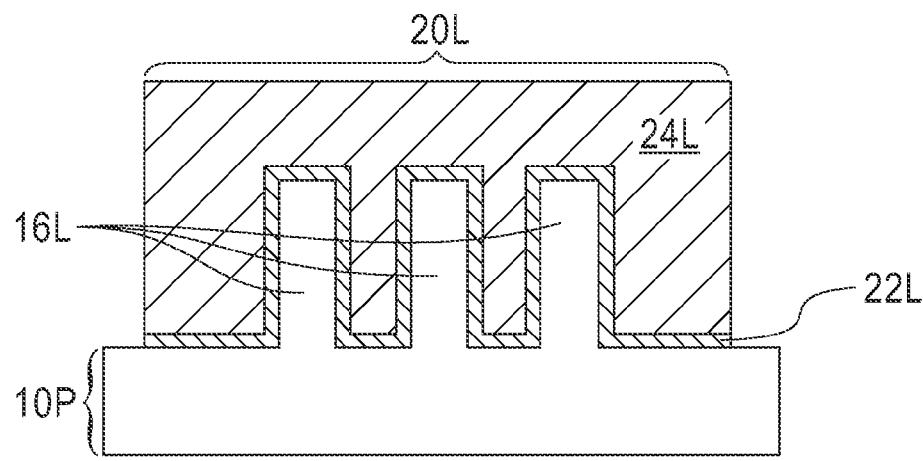
FIG. 6C is a vertical cross sectional view of the exemplary semiconductor structure along vertical plane C-C of FIG. 6A.
Figure 6D:
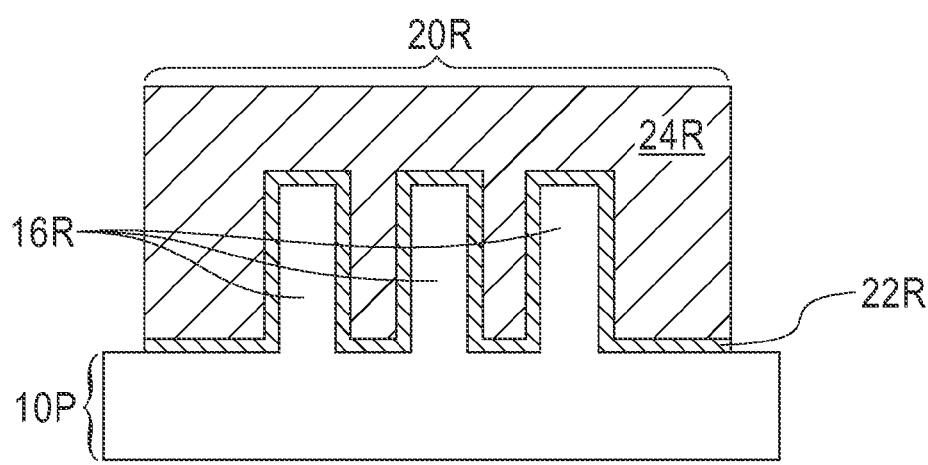
FIG. 6D is a vertical cross sectional view of the exemplary semiconductor structure along vertical plane D-D of FIG. 6A.

Referring first to FIGS. 1A-1C, there are illustrated various views of an exemplary semiconductor structure including a plurality of hard mask lines 12 located on a surface of a semiconductor substrate 10 that can be employed in accordance with an embodiment of the present application.

In some embodiments of the present application, the semiconductor substrate 10 can be a bulk semiconductor substrate. The term "bulk semiconductor substrate" denotes a substrate that is entirely composed of at least one semiconductor material. When a bulk semiconductor substrate is employed as semiconductor substrate 10, the bulk semiconductor substrate can be comprised of any semiconductor material including, but not limited to, Si, Ge, SiGe, SiC, SiGeC, and III/V compound semiconductors such as, for example, InAs, GaAs, and InP. Multilayers of these semiconductor materials can also be used as the semiconductor material of the bulk semiconductor substrate. In one embodiment, the bulk semiconductor substrate that can provide the semiconductor substrate 10 can be comprised of a single crystalline semiconductor material, such as, for example, single crystalline silicon. In other embodiments, the bulk semiconductor substrate that can provide the semiconductor substrate 10 may comprise a polycrystalline or amorphous semiconductor material.

In embodiments of the present application in which a bulk semiconductor substrate is employed as semiconductor substrate 10, semiconductor fins can be subsequently formed into a top portion of the bulk semiconductor substrate utilizing the method of the present application.

In another embodiment, the semiconductor substrate 10 may comprise a semiconductor-on-insulator (SOI) substrate (not specifically shown). Although not specifically shown, one skilled in the art understands that an SOI substrate includes a handle substrate, an insulator layer located on an upper surface of the handle substrate, and a topmost semiconductor layer located on an upper surface of the insulator layer. The handle substrate provides mechanical support for the insulator layer and the topmost semiconductor layer. In such an embodiment, the semiconductor fins can be subsequently processed into the topmost semiconductor layer of the SOI substrate utilizing the method of the present application. In this embodiment, the semiconductor fins (to be subsequently formed) are located on a topmost surface of the insulator layer.

The handle substrate and the topmost semiconductor layer of the SOI substrate may comprise the same, or different, semiconductor material. The semiconductor material of the handle substrate and the topmost semiconductor layer can include one of the semiconductor materials mentioned above for the bulk semiconductor substrate. Multilayers of semiconductor materials can also be used as the semiconductor material of the handle substrate and the topmost semiconductor layer. In one embodiment, the handle substrate and the topmost semiconductor layer are both comprised of silicon. In some embodiments, the handle substrate is a non-semiconductor material including, for example, a dielectric material and/or a conductive material. In yet other embodiments, the handle substrate can be omitted and a substrate including the insulator layer and the topmost semiconductor layer can be used in the present application.

In some embodiments, the handle substrate and the topmost semiconductor layer of the SOI substrate may have the same or different crystal orientation. For example, the crystal orientation of the handle substrate and/or the semiconductor layer may be {100}, {110}, or {111}. Other crystallographic orientations besides those specifically mentioned can also be used in the present application. The handle substrate and/or the top semiconductor layer of the SOI substrate may be a single crystalline semiconductor material, a polycrystalline material, or an amorphous material. Typically, at least the topmost semiconductor layer is a single crystalline semiconductor material. In some embodiments, the topmost semiconductor layer that is located atop the insulator layer can be processed to include semiconductor regions having different crystal orientations.

The insulator layer of the SOI substrate may be a crystalline or non-crystalline oxide or nitride. In one embodiment, the insulator layer is an oxide such as, for example, silicon dioxide. The insulator layer may be continuous or it may be discontinuous. When a discontinuous insulator region is present, the insulator region can exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the topmost semiconductor layer to a layer having a thickness that is more desirable.

In one example, the thickness of the topmost semiconductor layer of the SOI substrate can be from 10 nm to 100 nm. In another example, the thickness of the topmost semiconductor layer of the SOI substrate can be from 50 nm to 70 nm. In some embodiments, and when an ETSOI (extremely thin semiconductor-on-insulator) substrate is employed, the topmost semiconductor layer of the SOI has a thickness of less than 10 nm. If the thickness of the topmost semiconductor layer is not within one of the above mentioned ranges, a thinning step such as, for example, planarization or etching can be used to reduce the thickness of the topmost semiconductor layer to a value within one of the ranges mentioned above. The insulator layer of the SOI substrate typically has a thickness from 1 nm to 200 nm, with a thickness from 100 nm to 150 nm being more typical. The thickness of the handle substrate of the SOI substrate is inconsequential to the present application.

Each hard mask line of the plurality of hard mask lines 12 is located on a surface of the semiconductor substrate 10 and can be formed by patterning a blanket layer of hard mask material. By "blanket layer" it is meant a contiguous material layer that is formed on a surface of an underlying material. The blanket layer of hard mask material can include a semiconductor oxide, a semiconductor nitride, a semiconductor oxynitride or a combination thereof. In one example, the blanket layer of hard mask material comprises silicon dioxide. In another example, the blanket layer of hard mask material comprises silicon nitride. In yet a further example, the blanket layer of hard mask material can be a hard mask material stack of, in any order, silicon dioxide and silicon nitride.

In some embodiments of the present application, the blanket layer of hard mask material can be formed by a deposition process such as, for example, chemical vapor deposition (CVD) or plasma enhanced chemical vapor deposition (PECVD). In other embodiments of the present application, the blanket layer of hard mask material can be formed by a thermal process such as, for example, thermal oxidation and/or thermal nitridation. In yet a further embodiment, the blanket layer of hard mask material can be formed by a combination of a deposition process and a thermal process. In one embodiment of the present application, the blanket layer of hard mask material has a thickness from 1 nm to 20 nm. Other thicknesses that are lesser than, or greater than, the aforementioned thickness range may also be used as the thickness of the blanket layer of hard mask material.

After providing the blanket layer of hard mask material, the blanket layer of hard mask material is patterned to provide the plurality of hard mask lines 12. In one embodiment, the patterning of the blanket layer of hard mask material may comprise lithography and an anisotropic etch. Lithography includes forming a photoresist material (positive-tone, negative tone, or hybrid tone) on a surface of the blanket layer of hard mask material. The photoresist material can be formed as a blanket layer by a deposition process such as, for example, spin-on coating, CVD, PECVD, evaporation or chemical solution deposition. The blanket layer of photoresist material is then exposed to a desired pattern (i.e., line pattern) of irradiation and then the exposed photoresist material is developed utilizing a conventional resist developer. After developing the exposed photoresist material, an anisotropic etch is used to transfer the pattern into the blanket layer of hard mask material. Examples of anisotropic etching processes that can used to transfer the pattern may include dry etching (i.e., reactive ion etching, plasma etching, ion beam etching or laser ablation) and/or a chemical wet etch process. In one example, the anisotropic etch process used to transfer the pattern may include a reactive ion etch. Upon completion of the pattern transfer, the remaining portions of the photoresist material are removed utilizing a resist stripping process such as, for example, ashing.

In another embodiment of the present application, the patterning of the blanket layer of hard mask material may include a sidewall image transfer (SIT) process. The SIT process includes forming a contiguous mandrel material layer (not shown) on the blanket layer of hard mask material. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown) on the blanket layer of hard mask material.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Typically, the dielectric spacer material comprises a different dielectric material than both the mandrel structures and the blanket layer of hard mask material. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material as compared to the material of the dielectric spacers and the blanket layer of hard mask material. Following the mandrel structure removal, the SIT process continues by transferring the patterned provided by the dielectric spacers into the blanket layer of hard mask material. The pattern transfer may be achieved by an anisotropic etching process. Upon completion of the pattern transfer, the SIT process concludes by removing the dielectric spacers from the structure. Each dielectric spacer may be removed by etching or a planarization process.

Each hard mask line 12 that is formed has a length, as measured from east to west in the top down view, of from 30 nm to 2000 nm, and a width, as measured from north to south in the top down view, of from 5 nm to 30 nm. In another embodiment, the width of each hard mask line 12 is from 5 nm to 15 nm. Other lengths and/or other widths can be used as the length and width of each hard mask line 12. As is shown, each hard mask line of the plurality of hard mask lines 12 is orientated parallel to each other.

Referring now to FIGS. 2A-2D, there are illustrated various views of the exemplary semiconductor structure of FIGS. 1A-1C after cutting each hard mask line of the plurality of hard mask lines 12 to provide a plurality of first hard mask portions 12L located over one region of the semiconductor substrate 10, and a plurality of second hard mask portions 12R located over another region of the semiconductor substrate 10. The cutting of each hard mask line 12 may be performed by lithography (as defined above in forming each hard mask line 12) and an anisotropic etching (as defined above in formed each hard mask line 12). In one example, the anisotropic etch may comprise a reactive ion etch. In some embodiments, this step of the present application may be omitted and the process can proceed as described below in connection with FIGS. 3A-6D. In such an embodiment, each hard mask line represents a hard mask portion. Also, and in such an embodiment, the second hard mask portions are omitted and thus is the formation of the second semiconductor fins and second functional gate structure.

Each first hard mask portion 12L and each second hard mask portion 12R that are formed have a length, as measured from east to west in the top down view, of from 30 nm to 2000 nm, and a width, as measured from north to south in the top down view, of from 5 nm to 30 nm. Other lengths are also possible. In another embodiment, the width of each first hard mask portion 12L and each second hard mask portion 12R is from 5 nm to 15 nm. It is noted that the width of each first and second hard mask portion (12L, 12R) is the same as the width of each hard mask line 12 formed above. As is shown, each first hard mask portion 12L is orientated parallel to each other, and each second hard mask portion 12R is orientated parallel to each other. In the drawings, W1 denotes a width of each first hard mask portion 12L, while W2 denotes a width of each second hard mask portion 16R. In the drawings, S1 denotes the spacing between each first hard mask portion 12L, while S2 denotes the spacing between each second hard mask portion 12R.

In the present application, the first and second hard mask portions (12L, 12R) are employed as etch masks in defining semiconductor fins within an upper semiconductor material portion of the semiconductor substrate 10. As such, each semiconductor fin that is formed has a width, and spacing that is identical to the width and spacing of the hard mask portions that are employed in forming the same.

Referring now to FIGS. 3A-3D, there are illustrated various views of the exemplary semiconductor structure of FIGS. 2A-2D after forming a patterned photoresist 14P having an overlay tolerance of $(x+y)/2$ over preselected first and second hard mask portions (12L, 12R), wherein x is a width of a semiconductor fin (to be subsequently formed) and y is a distance between a neighboring pair of semiconductor fins (to be subsequently formed). Since the first and second hard mask portions (12L, 12R) are employed in forming each semiconductor fin, x is equal to W1 and W2 mentioned above, and y is equal to S1 and S2 mentioned above. The patterned photoresist 14P can be formed utilizing lithography and etching as mentioned above for patterning the blanket layer of hard mask material. The patterned photoresist 14P is aligned between two corresponding first or second hard mask portions (12L or 12R). In cases in which the hard mask line 12 cut was omitted, the hard mask line 12 may be used as the hard mask portions in this step of the present application.

Referring now to FIGS. 4A-4D, there are illustrated various views of the exemplary semiconductor structure of FIGS. 3A-3D after performing an isotropic etch to remove first and second hard mask portions (12L, 12R) not protected by the patterned photoresist 14P. In one embodiment of the present application, the isotropic etch comprises a chemical wet etch process in which a chemical etchant that is highly selective in removing any of the exposed first and second hard mask portions (12L, 12R) relative to the material of the patterned photoresist 14P and exposed semiconductor portions of semiconductor substrate 10 is employed. In one example, an HF etchant can be used to remove the first and second hard mask portions (12L, 12R) that are not protected by the patterned photoresist 14P.

Referring now to FIGS. 5A-5D, there are illustrated various views of the exemplary semiconductor structure of FIGS. 4A-4D after removing the patterned photoresist 14P and defining first semiconductor fins 16L within an upper semiconductor material portion of a first region of the semiconductor substrate 10 utilizing each remaining first hard mask portion 12L as a first fin forming etch mask, and defining second semiconductor fins 16R within the upper semiconductor portion of a second region of the semiconductor substrate 10 utilizing each remaining second hard mask portion 12R as a second fin forming etch mask. In the drawing, x denotes the fin width, and y denotes spacing between each semiconductor fin.

The removal of the patterned photoresist 14P can be performed utilizing any conventional resist removal (i.e., stripping) process such as, for example, ashing. The removal of the patterned photoresist 14P exposes each remaining first hard mask portion 12L, each remaining second hard mask portion 12R, and portions of the semiconductor substrate. An anisotropic etch is then employed to define the first and second semiconductor fins (16L, 16R) utilizing the first and second hard mask portions (12R, 12L) as an etch mask. In one embodiment, the anisotropic etch used in defining each first semiconductor fin 16L and each second semiconductor fin 16R comprises an anisotropic etching process such as, for example, reactive ion etching. When the first and second semiconductor fins (16L, 16R) are formed together at the same time, the first and second semiconductor fins (16L, 16R) are of a same height.

In some embodiments, it is possible to leave the patterned photoresist over either the remaining first hard mask portions 12L or the remaining second hard mask portions 12R and then performed a first anisotropic etch. After the first isotropic etch has been performed to define the first semiconductor fins 16L or the second semiconductor fins 16R, the patterned photoresist that remains can be removed, a block mask can be formed over the region in which the semiconductor fins were previously defined by the first anisotropic etch, and then a second anisotropic etch can be performed to define the remaining semiconductor fin, i.e., first or second semiconductor fins, not previously formed. The block mask can then be removed utilizing conventional etch back processes well known in the art. The formation of the first and second semiconductor fins at different times permits the formation of different height semiconductor fins.

As is shown, each first semiconductor fin 16L and each second semiconductor fin 16R extends upward from a remaining portion of the semiconductor substrate 10. The remaining portion of the semiconductor substrate 10 that is located beneath each first and second semiconductor fin (16L, 16R) can be referred to herein as a substrate 10P. In some embodiments and when the semiconductor substrate 10 is a bulk semiconductor substrate, substrate 10P comprises a remaining semiconductor material portion of the bulk semiconductor substrate. In such an embodiment (and as shown), no material interface is present between each first and second semiconductor fin (16L, 16R) and substrate 10P. In another embodiment of the present application, and when the semiconductor substrate 10 is an SOI substrate, substrate 10P represents an insulator layer of the SOI substrate. In such an embodiment (not shown), a material interface would be present between each first and second semiconductor fins (16L, 16R) and the substrate 10P.

The term "fin" refers to a contiguous structure including a semiconductor material, such as silicon, and including a pair of vertical sidewalls that are parallel to each other. As used herein, a surface is "vertical" if there exists a vertical plane from which the surface does not deviate by more than three times the root mean square roughness of the surface. In one embodiment of the present application, each first and second semiconductor fin (16L, 16R) can have a height from 10 nm to 100 nm, and a width from 5 nm to 30 nm. In another embodiment of the present application, each first and second semiconductor fin (16L, 16R) can have a height from 15 nm to 50 nm, and a width from 5 nm to 15 nm.

Referring now to FIG. 6A-6D, there are illustrated various views of the exemplary semiconductor structure of FIGS. 5A-5D after removing the remaining first and second hard mask portions (12L, 12R) from atop each first and second semiconductor fins (16L, 16R) and forming a first functional gate structure 20L straddling each first semiconductor fin 16L, and a second functional gate structure 20R straddling each second semiconductor fin 16R. In some embodiments (not shown), the first hard mask portions 12L and/or the second hard mask portions 12R may remain atop the corresponding fins. When the first hard mask portions 12L and/or the second hard mask portions 12R are removed, a planarization process such as, for example, chemical mechanical polishing and/or grinding may be used.

Although only one first functional gate structure 20L and only one second functional gate structure 20R are described and illustrated, a plurality of first and/or second functional gate structures can be formed as desired. By "functional gate structure" it is meant a permanent gate structure used to control output current (i.e., flow of carriers in the channel) of a semiconducting device through electrical or magnetic fields. Each functional gate structure 20L, 20R that is formed includes a gate material stack of, from bottom to top, a gate dielectric portion 22L, 22R, and a gate conductor portion 24L, 24R. In some embodiments (not shown), a gate cap portion can be present atop each gate conductor portion 24L, 24R. In yet another embodiment (not shown), a localized isolation structure can be formed on a remaining portion of the semiconductor substrate 10 and between each first semiconductor fin 16L and each second semiconductor fin 16R.

Each gate dielectric portion 22L, 22R comprises a dielectric material. The gate dielectric material that provides each gate dielectric portion 22L, 22R can be an oxide, nitride, and/or oxynitride. In one example, the gate dielectric material that provides each gate dielectric portion 22L, 22R can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as each gate dielectric portion 22L, 22R.

The gate dielectric material used in providing each gate dielectric portion 22L, 22R can be formed by any deposition process including, for example, chemical vapor deposition (CVD), plasma enhanced chemical vapor deposition (PECVD), physical vapor deposition (PVD), sputtering, or atomic layer deposition. In some embodiments, a thermal process including, for example, thermal oxidation and/or thermal nitridation may be used in forming the gate dielectric material of each gate dielectric portion 22L, 22R. In some embodiments, each gate dielectric portion 22L, 22R comprises a same gate dielectric material. In other embodiments, gate dielectric portion 22L comprises a different gate dielectric material from gate dielectric portion 22R. When a different gate dielectric material is used for the gate dielectric portions, block mask technology can be used. In one embodiment of the present application, the gate dielectric material used in providing each gate dielectric portion 22L, 22R can have a thickness in a range from 1 nm to 10 nm. Other thicknesses that are lesser than, or greater than, the aforementioned thickness range can also be employed for the gate dielectric material.

Each gate conductor portion 24L, 24R comprises a gate conductor material. The gate conductor material used in providing each gate conductor portion 24L, 24R can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, each gate conductor portion 24L, 24R may comprise an nFET gate metal. In other embodiments, each gate conductor portion 24L, 24R may comprise a pFET gate metal. In yet other embodiments, gate conductor portion 24L comprises an nFET gate metal, while gate conductor portion 24R comprises a pFET gate metal.

The gate conductor material used in providing each gate conductor portion 24L, 24R can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portions, block mask technology can be used. In one embodiment, the gate conductor material used in providing each gate conductor portion 24L, 24R has a thickness from 1 nm to 100 nm. Other thicknesses that are lesser than, or greater than, the aforementioned thickness range can also be employed for the gate conductor material used in providing each gate conductor portion 24L, 24R.

Each gate cap portion comprises a gate cap material. The gate cap material that provides each gate cap portion may include a hard mask material such as, for example, silicon dioxide, silicon nitride, and/or silicon oxynitride. The dielectric material that provides each gate cap portion can be formed utilizing a conventional deposition process such as, for example, chemical vapor deposition or plasma enhanced chemical vapor deposition. The dielectric material that provides each gate cap portion can have a thickness from 5 nm to 20 nm. Other thicknesses that are lesser than, or greater than, the aforementioned thickness range can also be employed as the thickness of the dielectric material that provides each gate cap portion.

Each functional gate structure 20L, 20R can be formed by providing a functional gate material stack of, from bottom to top, the gate dielectric material, the gate conductor material and, if present, the gate cap material. The functional gate material stack can then be patterned. In one embodiment of the present application, patterning of the functional gate material stack may be performed utilizing lithography and etching. Source/drain regions as described herein below can then be formed.

In other embodiments of the present application (not shown), sacrificial gate structures are first formed. By sacrificial gate structure" it is meant a material or material stack that serves as a placeholder for a subsequently formed functional gate structure. In such an embodiment, the gate dielectric portion of the functional gate structures may be U-shaped. By "U-shaped" it is meant a material that includes a bottom horizontal surface and a sidewall surface that extends upward from the bottom horizontal surface. When employed, the sacrificial gate structure may include a sacrificial gate dielectric portion, a sacrificial gate material portion and a sacrificial gate cap portion. In some embodiments, the sacrificial gate dielectric portion and/or sacrificial gate cap portion may be omitted. The sacrificial gate dielectric portion includes one of the dielectric materials mentioned above for the gate dielectric portions of the functional gate structures. The sacrificial gate material portion includes one of the gate conductor materials mentioned above for gate conductor portions of the functional gate structures. The sacrificial gate dielectric portion includes one of the gate cap material mentioned above for gate cap portions of the functional gate structures. The sacrificial gate structures can be formed by deposition of the various material layers and then patterning the resultant sacrificial material sack by utilizing, for example, lithography and etching. The sacrificial gate structures are replaced after forming source/drain regions.

Source/drain regions (not shown) are formed in exposed portions of the first and second semiconductor fins (16L, 16R) that are not covered by either the first and second functional gate structure (20L, 20R) or the sacrificial gate structures. Prior to source/drain formation, a gate spacer comprising a dielectric may be formed on the sidewalls of each functional gate structure or each sacrificial gate structure. The source/drain regions can be formed utilizing conventional techniques such as, for example, epitaxial growth, which are well known to those skilled in the art. As is known, the source region would be located on one side of each functional gate structure and the drain region would be located on another side of each functional gate structures. In some embodiments, the source/drain regions can be unmerged. In yet other embodiments, the source/drain regions can be merged. The source/drain regions comprise a semiconductor material and an n-type or p-type dopant. In some embodiments, the source/drain regions may comprise a same semiconductor material as that of each first and second semiconductor fins (16L, 16R). In some embodiments, the source/drain regions may comprise a different semiconductor material as that of the first semiconductor fin 16L and/or the second semiconductor fin 16R.

Although the above describes and illustrates a method in which unwanted hard mask portions are removed utilizing a patterned photoresist having an overlay tolerance of $(x+y)/2$, the method can also be used to remove unwanted semiconductor fins portions. In such a method, semiconductor fin lines can be formed utilizing a conventional technique such as, for example, lithography and etching, or a SIT process (both of which are described above in forming the hard mask line). The semiconductor fin lines that are formed can then be optionally cut utilizing a first photoresist mask and an anisotropic etch. In some embodiments in which the length of the semiconductor fin lines is small, the first cutting step may be omitted (the cut semiconductor fin lines or fin lines having a short length can be referred to herein as semiconductor fin portions). Next, the patterned photoresist having an overlay tolerance of $(x+y)/2$ is formed protecting some of the semiconductor fin portions; in this embodiment x is the width of a semiconductor fin portion, while y is a spacing between a neighboring pair of semiconductor fin portions. An isotropic etch, as described herein, can then be used to remove the semiconductor fin portions that are not protected by the patterned photoresist. The patterned photoresist can be removed as described above and functional gate structures straddling each remaining semiconductor fin portion can be formed as described above.

Figure 7A:
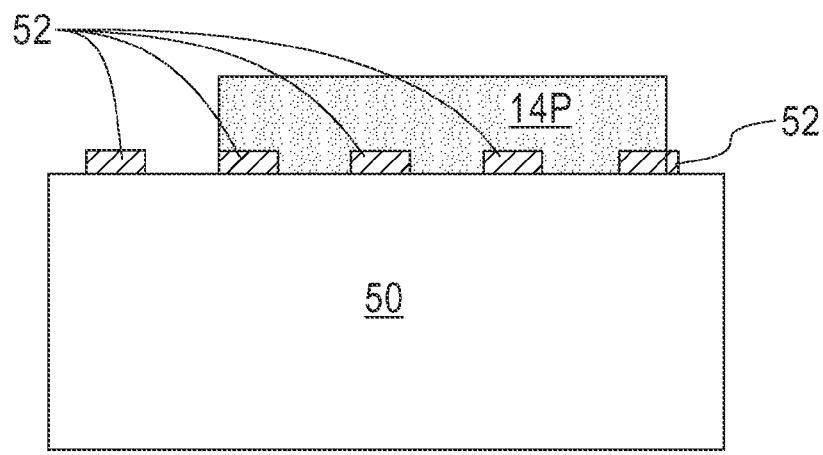
FIG. 7A is a vertical cross sectional view showing a worse case misalignment for positioning a patterned photoresist having a tolerance of (x+y)/2 over some of the patterned hard mask portions or semiconductor fin portions in accordance with the present application.
Figure 7B:
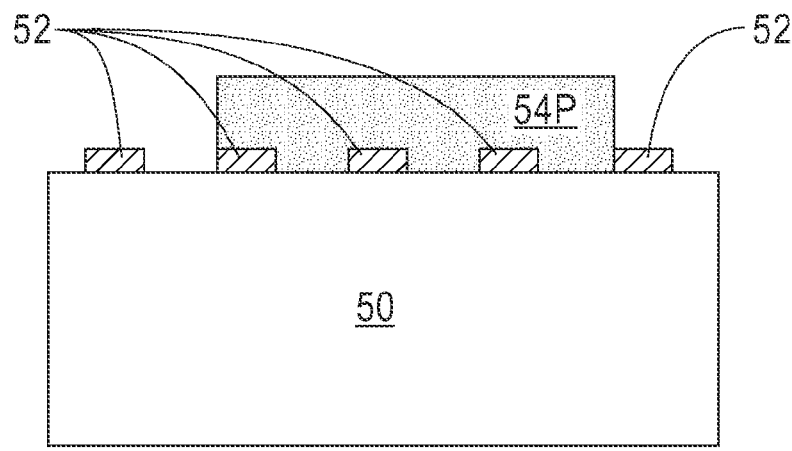
FIG. 7B is s vertical cross sectional view showing a worse case misalignment for positioning a patterned photoresist having a tolerance of y/2 over some of the patterned hard mask portions or semiconductor fin portions in accordance with a typical prior art process.
Figure 8A:
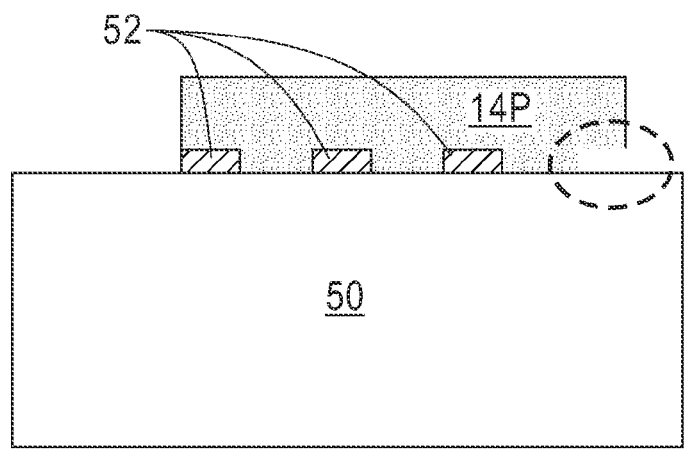
FIG. 8A is a vertical cross sectional view showing the exemplary semiconductor structure of FIG. 7A after performing an anisotropic etch to remove patterned photoresist portions or semiconductor fin portions not protected by the patterned photoresist in accordance with the present application.
Figure 8B:
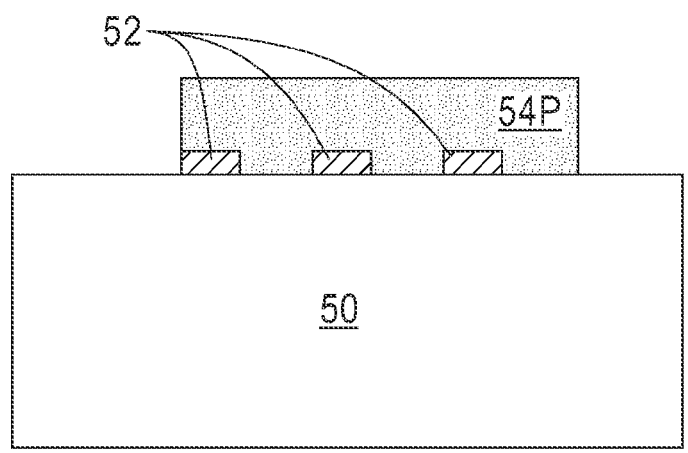
FIG. 8B is a vertical cross sectional view showing the exemplary prior art semiconductor structure of FIG. 7B after performing an anisotropic etch to remove patterned photoresist portions or semiconductor fin portions not protected by the patterned photoresist.

Reference is now made to FIGS. 7A, 7B, 8A, and 8B which compare a worst case misalignment of the method of the present application (FIGS. 7A and 8A) to a worst case misalignment of a prior art scheme (FIGS. 7B and 8B). In the present process, the patterned photoresist 14P is used, while in the prior art process, a patterned photoresist 54P having an overlay tolerance of $y/2$ is used. In the drawings, element 50 may represent a semiconductor substrate prior to semiconductor fin formation or a remaining portion of the semiconductor substrate after semiconductor fin formation. In drawings, element 52 represents either a hard mask portion (like 12R, 12L defined above) or a semiconductor fin portion which has been formed and optionally cut utilizing conventional processes as described in the paragraph above. In FIG. 8A, an isotropic etch as defined in the present application is used to remove the non-protected hard mask portions or the non-protected semiconductor fin portions, while in FIG. 8B and as is conventional, an anisotropic etch is used. In FIG. 8A, and due to the use of the isotropic etch, any hard mask portion or semiconductor fin portion 52 that is even partially exposed, is removed during the etch; see circled region in FIG. 8A. Thus, the method of the present application allows the removal of any unwanted stinger (i.e., straggling) hard mask portions or semiconductor fin portions that is caused by patterned photoresist misaligned from the structure.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
    providing a plurality of hard mask portions on a semiconductor substrate, wherein said providing said plurality of hard mask portions comprises forming a blanket layer of hard mask material on said semiconductor substrate, and patterning said blanket layer of hard mask material;
    forming a patterned photoresist having an overlay tolerance of $(x+y)/2$ over preselected hard mask portions, wherein x is a width of a semiconductor fin and y is a distance between a neighboring pair of semiconductor fins;
    removing hard mask portions not protected by said patterned photoresist by an isotropic etching process;
    removing said patterned photoresist; and
    forming semiconductor fins in an upper semiconductor material portion of said semiconductor substrate, wherein said remaining hard mask portions are employed as fin forming etch masks.

2. The method of claim 1, wherein said patterning said blanket layer of hard mask material comprises lithography and etching.

3. The method of claim 1, wherein said patterning said blanket layer of hard mask material comprises a sidewall image transfer process.

4. The method of claim 1, further comprising cutting each hard mask portion to provide a plurality of first hard mask portions located over one area of said semiconductor substrate, and a plurality of second hard mask portions located over another area of said semiconductor substrate.

5. The method of claim 4, wherein said cutting comprises an anisotropic etching process.

6. The method of claim 1, wherein each hard mask portion has a width from 5 nm to 30 nm.

7. The method of claim 1, wherein said isotropic etching process comprising contacting said exposed hard mask portions with a chemical wet etchant.

8. The method of claim 1, wherein said removing said patterned photoresist comprises a resist stripping process.

9. The method of claim 1, wherein said forming semiconductor fins in said upper semiconductor material portion of said semiconductor substrate comprises an anisotropic etch process.

10. The method of claim 1, further comprising removing each remaining hard mask portion utilizing a planarization process.

11. The method of claim 1, further comprising forming a functional gate structure straddling each semiconductor fin.

12. The method of claim 11, wherein said forming said functional gate structure comprises:
    forming a sacrificial gate structure straddling each semiconductor fin; and
    replacing said sacrificial gate structure with said functional gate structure.

13. The method of claim 1, wherein said semiconductor substrate is a bulk semiconductor substrate.

14. The method of claim 1, wherein said semiconductor substrate is a semiconductor-on-insulator, and said upper semiconductor material portion of said semiconductor substrate is a top semiconductor layer of said semiconductor-on-insulator substrate.

15. The method of claim 14, wherein an insulator layer is located beneath each semiconductor fin.

16. A method of forming a semiconductor structure, said method comprising:
    forming a blanket layer of hard mask material on said semiconductor substrate, and patterning said blanket layer hard mask material to provide a plurality of first hard mask portions located over one area of a semiconductor substrate, and a plurality of second hard mask portions located over another area of said semiconductor substrate;
    forming a patterned photoresist having an overlay tolerance of $(x+y)/2$ over preselected first and second hard mask portions, wherein x is a width of a semiconductor fin and y is a distance between a neighboring pair of semiconductor fins;
    removing first and second hard mask portions not protected by said patterned photoresist by an isotropic etching process;
    removing said patterned photoresist; and
    forming first semiconductor fins in an upper semiconductor material portion of, and in a first region of, said semiconductor substrate and forming second semiconductor in said upper semiconductor material portion of, and in a second region of, said semiconductor substrate, wherein said remaining first hard mask portions are employed as first semiconductor fin forming etch masks and said second hard mask portions are employed as second semiconductor fin forming etch masks.

* * * * *